United States Patent
Yahiro et al.

(10) Patent No.: US 6,218,058 B1
(45) Date of Patent: Apr. 17, 2001

(54) CHARGED PARTICLE BEAM TRANSFER MASK

(75) Inventors: Takehisa Yahiro, Kawasaki; Kazuaki Suzuki, Tokyo-to; Shin-ichi Kojima, Kawasaki, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/363,686

(22) Filed: Jul. 29, 1999

(30) Foreign Application Priority Data

Aug. 4, 1998 (JP) .................................................. 10-231144

(51) Int. Cl.$^7$ ................................ G03F 9/00; G03C 5/00; G21G 5/00

(52) U.S. Cl. ............................ 430/5; 430/296; 250/492.3

(58) Field of Search ............................... 430/5, 322, 296; 250/492.22, 492.23, 492.2, 492.3

(56) References Cited

U.S. PATENT DOCUMENTS 5,952,155 * 9/1999 Sakakibara et al. .................. 430/5
6,034,376 * 3/2000 Ema ....................................... 430/5

* cited by examiner

*Primary Examiner*—S. Rosasco
(74) *Attorney, Agent, or Firm*—Chapman and Cutler

(57) ABSTRACT

A charged particle beam transfer mask (6) has a plurality of subfields (8) each of which having a different pattern density. The charged particle beam transfer mask (6) divide-irradiates a charged particle beam (5) for each of the subfields (8) and reduce-transfers a pattern onto a sensitive substrate. The charged particle beam transfer mask (6) corrects the differences in the de-focus amounts (3) caused by Coulomb effect due to the different pattern densities when the pattern is transferred for each of the subfields (8) so as to eliminate the differences in the de-focus amounts (3) caused by Coulomb effect by pre-varying the position (height) of each of the subfields (8) in the optical axis direction.

6 Claims, 6 Drawing Sheets

CHARGED PARTICLE BEAM TRANSFER MASK

BACKGROUND OF THE INVENTION

1. Field of the Invention

The present invention relates to a charged particle transfer mask designed to form on a sensitive substrate a fine high density pattern that is less than 100 nm in size with high throughput and accuracy. In particular, the present invention relates to a charged particle transfer mask which corrects the de-focus caused by the Coulomb effect which occur when the pattern density is non-uniform and a pattern distortion caused by the Coulomb effect.

2. Description of the Related Art

A conventional electron beam exposure system irradiates an electron beam onto a mask (reticle) having a circuit pattern of one entire semiconductor chip, and reduce-transfers the image of the pattern within the irradiation range using 2-stage projection lenses. In this case, when an attempt is made to transfer the pattern at once by batch-irradiating the electron beam onto the entire range of the mask, the pattern cannot be transferred accurately. A division transfer system capable of transferring a pattern more accurately than this conventional system is being proposed.

An apparatus compatible with this division transfer system which forms a reduced image of the mask on a sensitive substrate mounted on a stage by dividing the mask into small regions (subfields) and moving or continuously scanning an irradiation beam for each of the subfields based on the step-and-repeat system is known from the prior art.

Also, another method of forming a reduced image of a mask onto a sensitive substrate is known. In this method, an electron beam is irradiated onto a mask having a membrane on which a pattern is formed with a scattering body or an electron beam is irradiated onto such a mask whose scattering body has holes. The beam scattered with the scattering body is then removed at a contrast aperture.

When the current supplied to the beam is increased for the conventional mask so as to increase the throughput, the beam is blurred or the focus position of the beam is displaced by the Coulomb effect (hereafter this state will be called the state of "de-focus"), and the image is distorted. Moreover, in a subfields on which the pattern density is non-uniform, the degree of the blur of the beam or the amount of distortion or de-focus is increased. Here, the image distortion refers to the entire displacement from the set values for the shape of the image, including the displacement in the rotation angle of the image and the displacement in the magnification factor.

For example, when the pattern density (the electric current amount) differs from one subfields to another in the mask, the amount of de-focus caused by the Coulomb effect differs from one subfields to another accordingly. Therefore, the height (position) of the focal point plane differs from one sub-field to another. In such a case, the height of the sensitive substrate needs to be adjusted by moving the stage in the height direction or re-focusing the electronic optical system.

Moreover, when the electron beam is irradiated onto the mask, the current distribution generated inside the subfields becomes non-uniform. This non-uniformly distributed current creates a large non-uniform distortion on the transferred pattern. Here, the non-uniform pattern distortion refers to, for example, a distortion type that transfers a relatively long straight line pattern on the mask onto a curve of high order. It is very hard to correct such a distortion using the electronic optical system.

As said above, in general, the de-focus, magnification error (displacement), rotation error, orthogonal error (square pattern to parallelogram) and non-linear distortion (as shown in FIG. 10) are caused by Coulomb effect. These errors are generated at a large beam current. Especially large non-linear distortion is generated by non-uniform pattern distribution in the subfields.

Given these problems, it is an object of the present invention to provide a charged particle beam transfer mask in which the differences in the amount of de-focus caused by Coulomb effect, which are generated when the pattern density is non-uniform from one sub-field to another, are corrected. It is also an object of the present invention to provide a charged particle beam transfer mask in which the pattern distortion caused by the Coulomb effect is corrected.

SUMMARY OF THE INVENTION

To solve the above-stated problems, a charged particle beam transfer mask according to the first aspect of the invention has a plurality of subfields each of which having a different pattern density. This charged particle beam transfer mask divide-irradiates a charged particle beam for each of the subfields and reduce-transfers a pattern onto a sensitive substrate. This charged particle beam transfer mask corrects a difference in de-focus amounts due to the Coulomb effect caused by different pattern densities when the pattern is transferred for each of the subfields so as to eliminate the difference in the de-focus amounts by pre-varying the position of each of the subfields in the optical axis direction.

In manufacturing a charged particle beam transfer mask according to the first aspect of the invention, the differences in the de-focus amounts caused by the Coulomb effect that are generated when the pattern density is non-uniform are corrected by obtaining the de-focus amount caused by the Coulomb effect that corresponds to each of the subfields before manufacturing the mask. The position of subfields of the mask is pre-varied in the optical axis direction so as to eliminate the de-focus amounts. In this way, the focal point position of the image can be held constant.

A charged particle beam transfer mask according to the second aspect of the invention has subfields each of which having a pattern. This charged particle beam transfer mask divide-irradiates a charged particle beam for each of the subfields and reduce-transfers a pattern onto a sensitive substrate. This charged particle beam transfer mask corrects a pattern distortion caused by a Coulomb effect that is generated when the pattern inside the subfields is transferred so as to eliminate the pattern distortion by pre-distorting the pattern inside the subfields. It is desirable that the pattern distortion include a rotation displacement of an image or a magnification factor displacement or a high order curve-shaped displacement.

In manufacturing a charged particle beam transfer mask according to the second aspect of the invention, the pattern distortion caused by the Coulomb effect that is hard to correct in the electronic optical system is corrected by obtaining a distortion caused by the Coulomb effect for each of the subfields before manufacturing the mask. The mask is pre-distorted so as to eliminate the distortion generated by the Coulomb effect.

DESCRIPTION OF THE PREFERRED EMBODIMENTS

Figure 1A:
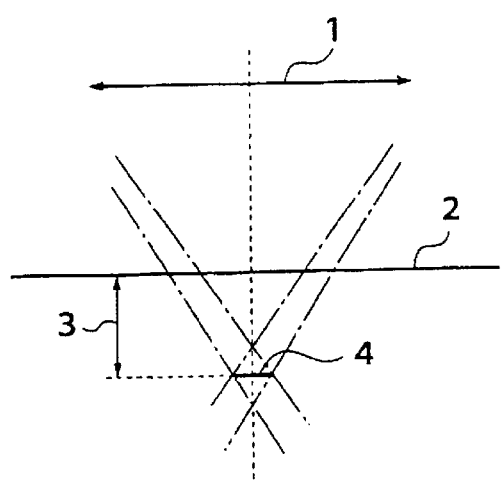
FIGS. 1(*a*) and (*b*) show a difference in the states of the de-focus caused by the Coulomb effect that occurs when sub-fields having different pattern densities are transferred onto a sensitive substrate.
FIG. 1(c) is a cross sectional view of a charged particle beam transfer mask according to the first embodiment of the present invention.
Figure 1B:
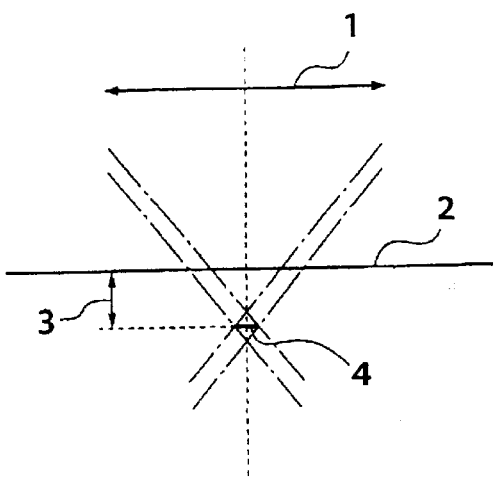

In what follows, preferred embodiments of the invention will now be explained with reference to the attached drawings. FIG. 1(a) shows the state of de-focus caused by the Coulomb effect in a sub-field having a large pattern density (the amount of current that reaches the sensitive substrate surface is large) on a charged particle beam transfer mask. FIG. 1(b) shows the state of de-focus caused by the Coulomb effect for a sub-field having a small pattern density (the amount of the current that reaches the sensitive substrate surface is small) on a charged beam transfer mask. That is, FIGS. 1(a) and (b) show a difference in the de-focus amount caused by the Coulomb effect that occurs when sub-fields having different pattern densities are transferred onto a sensitive substrate.

As shown in FIGS. 1(a) and (b), the pattern beam that has passed through a mask (not shown in the drawing) is reduced by the lens 1. The image of the pattern beam is then formed in the neighborhood of the focal point plane 2. In this case, the Coulomb effect blur 4 is generated in the exposed pattern. Moreover, the Coulomb effect of the pattern beam that has passed through the mask is large in the sub-field having the large pattern density shown in FIG. 1(a), and small in the sub-field having the small pattern density shown in FIG. 1(b). Hence, the de-focus amount 3 caused by the Coulomb effect which is equal to the distance between the focal point plane 2 and the blur 4 caused by the Coulomb effect is larger in the sub-field having the large pattern density shown in FIG. 1(a) than in the sub-field having the small pattern density shown in FIG. 1(b).

Figure 1C:
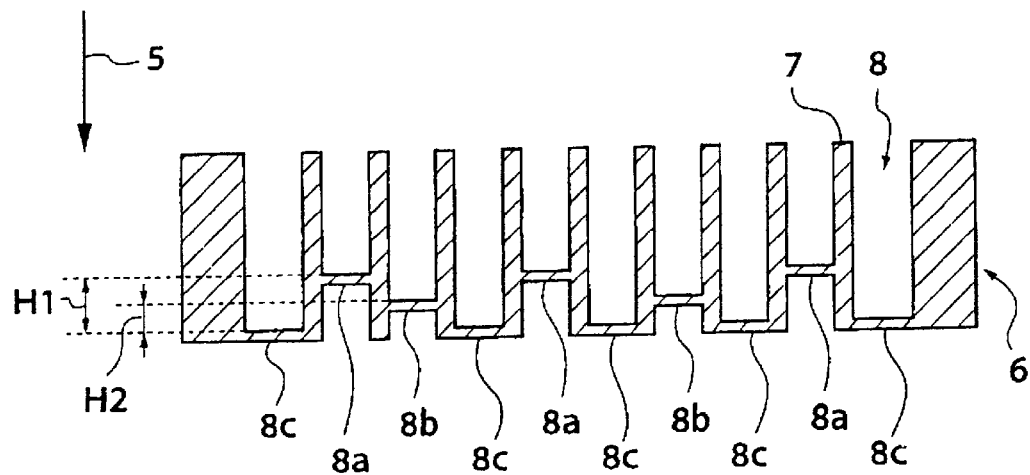

FIG. 1(c) is a cross sectional view of a charged particle beam transfer mask according to the first embodiment of the present invention. The charged particle beam transfer mask 6 is a magnifying mask of the pattern that is used in a divide-transfer system charged particle beam transfer apparatus. In this charged particle beam transfer mask 6, the differences in the de-focus amounts caused by the Coulomb effect that are generated by the differences in the pattern densities (current amounts) between the small fields (subfields) are corrected.

This mask 6 has multiple sub-fields 8 that are serially connected by the mask supporter 7. Each of these sub-fields 8 is made of a thin film having a magnified transfer pattern. This mask is manufactured by etching a silicon substrate. These sub-fields 8 are classified into, for example, three types based on their pattern densities. That is, those sub-fields having a large pattern density are classified as sub-fields 8a, those sub-fields having a medium pattern density are classified as sub-fields 8b, and those sub-fields having a small pattern density are classified as sub-fields 8c. The positions of these subfields in the optical axis direction (the direction in which the charged particle beam 5 is irradiated onto the mask 6) are determined as follows. The subfields 8a having a large density are formed at the highest position. The subfields 8c having a small density are formed at the lowest position. The subfields 8b having a medium density are formed at intermediate positions.

By forming a mask 6 having steps whose heights are varied for each sub-field in this way, the distances between the charged particle beam source (not shown in the drawing) and the sub-fields 8a, 8b, and 8c can be pre-set differently corresponding to the de-focus amount caused by the Coulomb effect, respectively, when the pattern is transferred setting the mask 6 on the charged particle beam transfer apparatus. More specifically, the distance between the charged particle beam source and the sub-field 8a having a large de-focus amount caused by the Coulomb effect and a far focal point position is set short. On the other hand, the distance between the charged particle beam source and the sub-field 8c having a small de-focus amount caused by the Coulomb effect and a near focal point position is set long. As a result, the focus amounts caused by the Coulomb effect that differ between the sub-fields are corrected and the focal point position of the image can be held constant.

The heights of the thin films that constitute the sub-fields 8 are suitably pre-set before manufacturing the mask.

That is, the de-focus amount caused by the Coulomb effect that corresponds to the pattern density of each sub-field is obtained by, for example, a simulation. The differences in the de-focus amounts between the sub-fields caused by Coulomb effect are canceled with each other. The heights of the thin films are pre-obtained in this way so that the focal point position of the image will be held constant. After this, the mask is manufactured whose thin films are formed at the suitable heights.

Next, an exemplary method of manufacturing the mask shown in FIG. 1(c) will be explained with reference to FIGS. 2 through 7. FIGS. 2 through 7 are cross sectional views of the manufacturing method of the charged particle transfer mask shown in FIG. 1(c).

Figure 2:
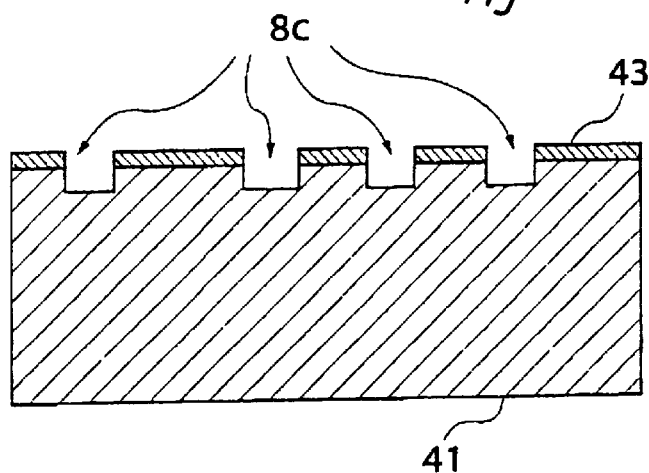
FIG. 2 is a cross sectional view of the manufacturing method of the charged particle transfer mask shown in FIG. 1(c).

First, as shown in FIG. 2, a resist film 43 is formed on the surface of the silicon substrate 41 and the pattern is transferred onto this resist film 43. Next, the sub-field 8c whose pattern density on the silicon substrate 41 is small is etched by a prescribed amount using the patterned resist film 43 as a mask.

Figure 3:
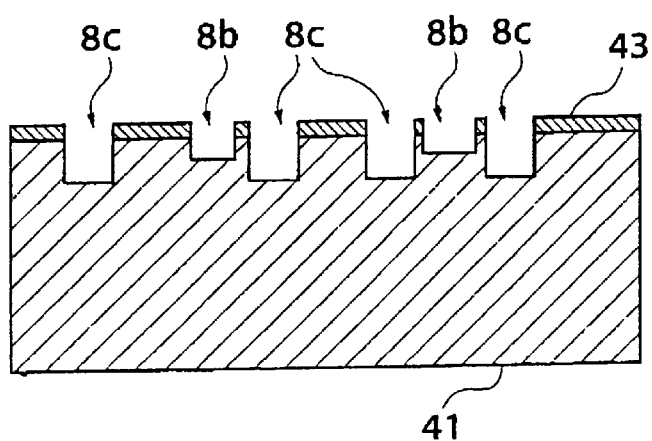
FIG. 3 is a cross sectional view of the manufacturing method of the charged particle transfer mask shown in FIG. 1(c) showing the process that follows the process shown in FIG. 2.

Next, as shown in FIG. 3, by patterning the resist film 43, the sub-field 8b whose pattern density on the resist film 43 is intermediate is further opened. Next, the sub-fields 8c and 8b whose pattern densities are small and intermediate on the silicon substrate 41 are etched by prescribed amounts, respectively, using the patterned resist film 43 as a mask.

Figure 4:
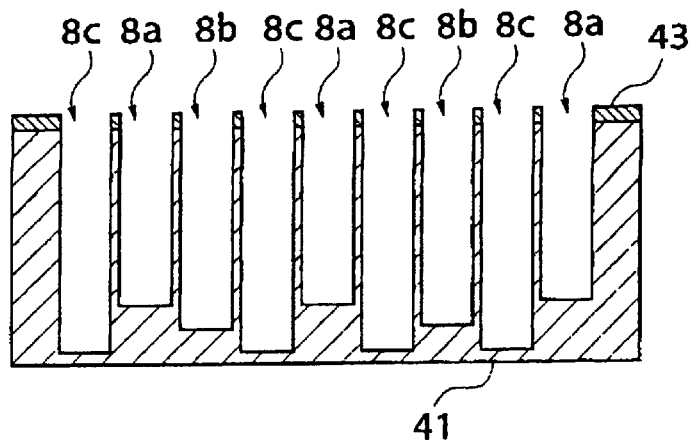
FIG. 4 is a cross sectional view of the manufacturing method of the charged particle transfer mask shown in FIG. 1(c) showing the process that follows the process shown in FIG. 3.

After this, as shown in FIG. 4, by patterning the resist film 43, the sub-field 8a whose pattern density on the resist film 43 is large is further opened. Next, the sub-fields 8c, 8b, and 8a whose pattern densities are small, intermediate, and large on the silicon substrate 41 are etched by prescribed amounts, respectively, using the patterned resist film 43 as a mask.

Figure 5:
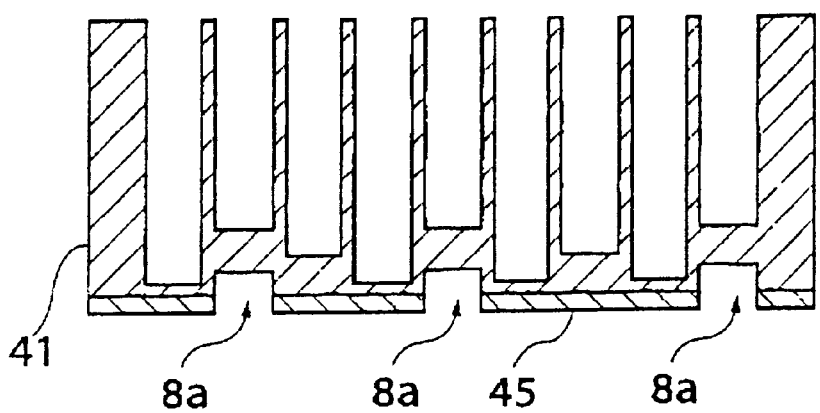
FIG. 5 is a cross sectional view of the manufacturing method of the charged particle transfer mask shown in FIG. 1(c) showing the process that follows the process shown in FIG. 4.

After this, as shown in FIG. 5, the resist film 43 is removed. A resist film 45 is then formed on the back surface of the silicon substrate 41. This resist film 45 is then patterned. Next, the sub-fields 8a whose pattern densities are large on the silicon substrate 41 are etched by a prescribed amount using the patterned resist film 45 as a mask.

Figure 6:
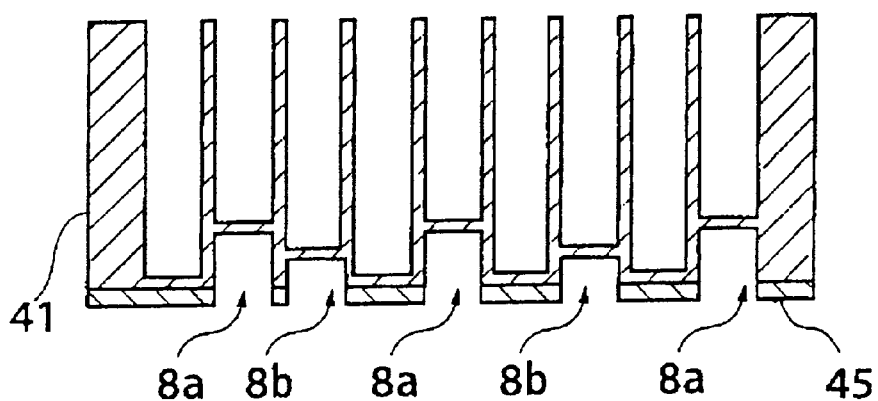
FIG. 6 is a cross sectional view of the manufacturing method of the charged particle transfer mask shown in FIG. 1(c) showing the process that follows the process shown in FIG. 5.

Next, as shown in FIG. 6, by patterning the resist film 45, the sub-field 8b whose pattern density on the resist film 45 is intermediate is further opened. Next, the sub-fields 8b and 8a whose pattern densities are intermediate and large on the silicon substrate 41 are etched by prescribed amounts, respectively, using the patterned resist film 45 as a mask.

Figure 7:
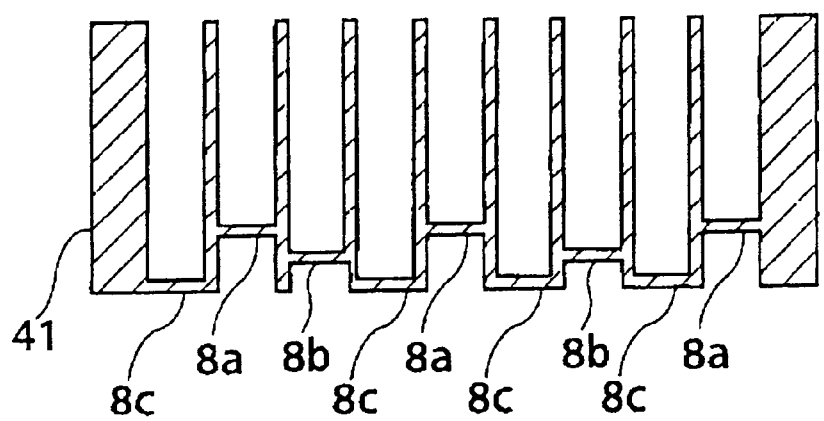
FIG. 7 is a cross sectional view of the manufacturing method of the charged particle transfer mask shown in FIG. 1(c) showing the process that follows the process shown in FIG. 6.

After this, as shown in FIG. 7, the resist film 45 is removed. In this way, the charged particle beam transfer mask is manufactured.

According to the first embodiment of the present invention, in the charged particle beam transfer mask that reduce-transfers a pattern for each sub-field, the heights of the sub-fields are varied so that the differences in the de-focus amounts caused by Coulomb effect that are generated when the pattern density is non-uniform will be canceled with each other. As a result, the de-focus amounts caused by Coulomb effect that differs among the sub-fields are corrected, and the influence of the differences is minimized. Thus, the focal point position of the image can be held constant. Hence, there is no need to adjust the height of the sensitive substrate moving the electronic optical system or stage in the height direction. Thus, the load on the electronic optical system and the stage is reduced significantly.

Figure 8:
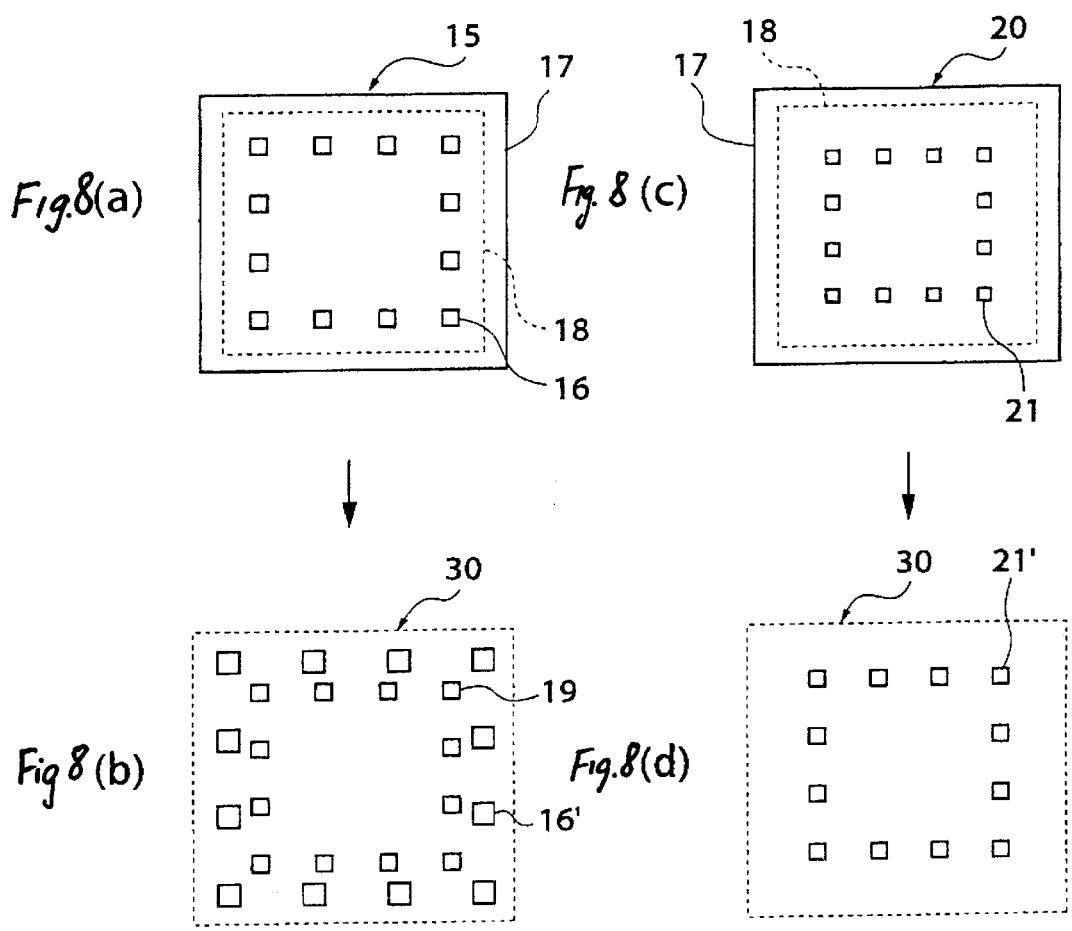
FIGS. 8(a) through (d) show a charged particle beam transfer mask according to the second embodiment of the present invention.

FIG. 8 shows a charged particle beam transfer mask according to the second embodiment of the present invention. This charged particle beam transfer mask is a pre-distorted mask for correcting the displacement in the magnification factor of the transfer image caused by the Coulomb effect.

FIG. 8(a) is a top view of a sub-field of a mask in which the magnification factor displacement of the transferred image caused by the Coulomb effect that occurs when the pattern of the sub-field is transferred to the sensitive substrate is not corrected. FIG. 8(b) is a top view showing the state of the magnification factor displacement of the transferred image caused by the Coulomb effect that occurs when the pattern of the sub-field is transferred to the sensitive substrate. FIG. 8(c) is a top view showing the sub-field of the mask in which the magnification factor displacement of the transferred image caused by the Coulomb effect is corrected. FIG. 8(d) is a top view showing the transferred image of the pattern of the sub-field shown in FIG. 8(c) transferred to the sensitive substrate.

The sub-field 15 shown in FIG. 8(a) is made of a membrane region 17 having a stencil pattern 16. By irradiating a charged particle beam onto the illumination region 18 that includes the entire stencil pattern 16 on the membrane region 17, the stencil pattern 16 of the sub-field 15 is transferred to the sensitive substrate 30 as shown in FIG. 8(b). In this case, a magnification factor displacement is generated in the transferred pattern 16' of the stencil pattern 16 by the Coulomb effect. That is, the transferred pattern 16' of the stencil pattern 16 is enlarged with respect to the ideal transfer position 19 to which the stencil pattern 16 would be transferred if the magnification factor displacement had not been generated. Therefore, by manufacturing a pre-distorted mask in which the pattern inside the sub-field is distorted so as to cancel such a magnification factor displacement, the pattern of this mask can be transferred to the ideal transfer position 19 on the sensitive substrate.

In the present embodiment, as shown in FIG. 8(c), a pre-distorted mask in which the magnification factor displacement of the transferred image caused by the Coulomb effect is pre-corrected is manufactured. Therefore, as shown in FIG. 8(d), when the stencil pattern 21 of the sub-field 20 of the mask is transferred to the sensitive substrate 30, the stencil pattern 21 can be transferred to the ideal transfer position even if a magnification factor displacement is generated in the transferred pattern 21' by the Coulomb effect.

The pattern magnification factor displacement distortion inside the sub-field 20 of the pre-distorted mask that eliminates the magnification factor displacement of the transferred image caused by the Coulomb effect is obtained before manufacturing the mask, for example by a simulation, for example, using soft ware "Boersch" manufactured by MEBS.

Figure 9:
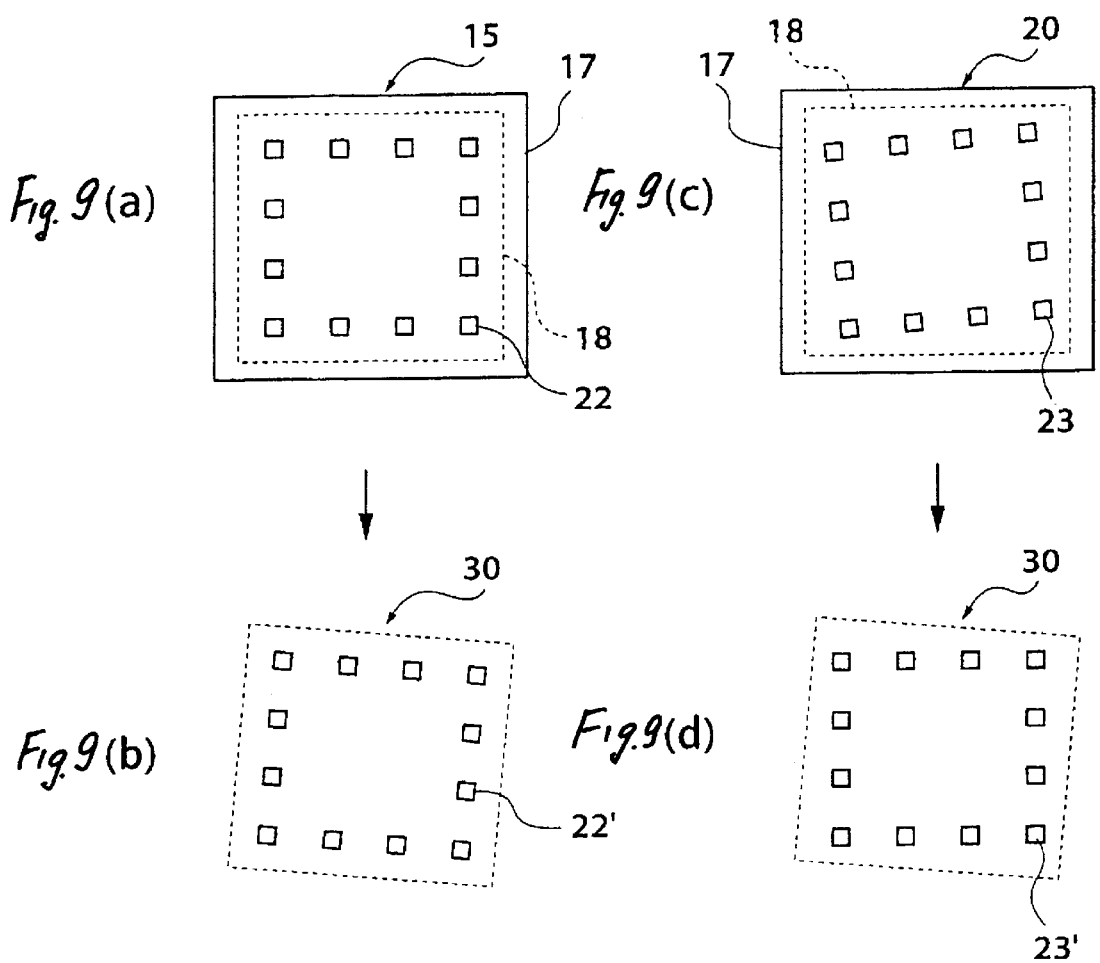
FIGS. 9(a) through (d) show a charged particle beam transfer mask according to the third embodiment of the present invention.

FIG. 9 shows a charged particle beam transfer mask according to the third embodiment of the present invention. This charged particle beam transfer mask is a pre-distorted mask that corrects a rotation displacement of the transferred image caused by the Coulomb effect.

FIG. 9(a) is a top view of a sub-field of a mask in which the rotation displacement of the transfer image caused by the Coulomb effect that occurs when the pattern of the sub-field is transferred to the sensitive substrate is not corrected. FIG. 9(b) is a top view showing the state of the rotation displacement of the transfer image caused by the Coulomb effect that occurs when the pattern of the sub-field shown in FIG. 9(a) is transferred to the sensitive substrate. FIG. 9(c) is a top view showing the sub-field of the mask in which the rotation displacement of the transfer image caused by the Coulomb effect is corrected. FIG. 9(d) is a top view showing the transfer image of the pattern of the sub-field shown in FIG. 9(c) transferred to the sensitive substrate.

The sub-field 15 shown in FIG. 9(a) is made of a membrane region 17 having a stencil pattern 22. By irradiating a charged particle beam onto the illumination region 18 that includes the entire stencil pattern 22 on the membrane region 17, the stencil pattern 22 of the sub-field 15 is transferred to the sensitive substrate 30 as shown in FIG. 9(b). In this case, a rotation displacement is generated in the transferred pattern 22' of the stencil pattern 22 by the Coulomb effect. That is, the transferred pattern 22' of the stencil pattern 22 is angular-displaced with respect to the ideal transfer position to which the stencil pattern 22 would be transferred to if the rotation displacement had not been generated.

In the present embodiment, as shown in FIG. 9(c), a pre-distorted mask in which the rotation displacement of the transferred image caused by the Coulomb effect is pre-corrected is manufactured. Therefore, as shown in FIG. 9(d), when the stencil pattern 23 of the sub-field 20 of the mask is transferred to the sensitive substrate 30, the stencil pattern 23 can be transferred to the ideal transfer position even if a rotation displacement is generated in the transferred pattern 23' of the stencil pattern 23 by the Coulomb effect.

The pattern rotation displacement distortion inside the sub-field 20 of the pre-distorted mask that eliminates the rotation displacement of the transferred image caused by the Coulomb effect is obtained before manufacturing the mask, for example, by a simulation.

Figure 10:
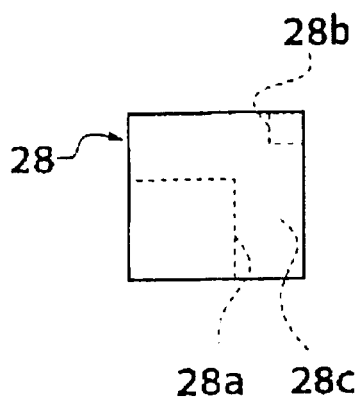
FIGS. 10(a) through (c) show a charged particle beam transfer mask according to the fourth embodiment of the present invention explaining a pre-distorted mask in which the image distortion generated by the Coulomb effect that occurs in transferring a subfields on which the current distribution is non-uniform is pre-corrected.
Figure 10:
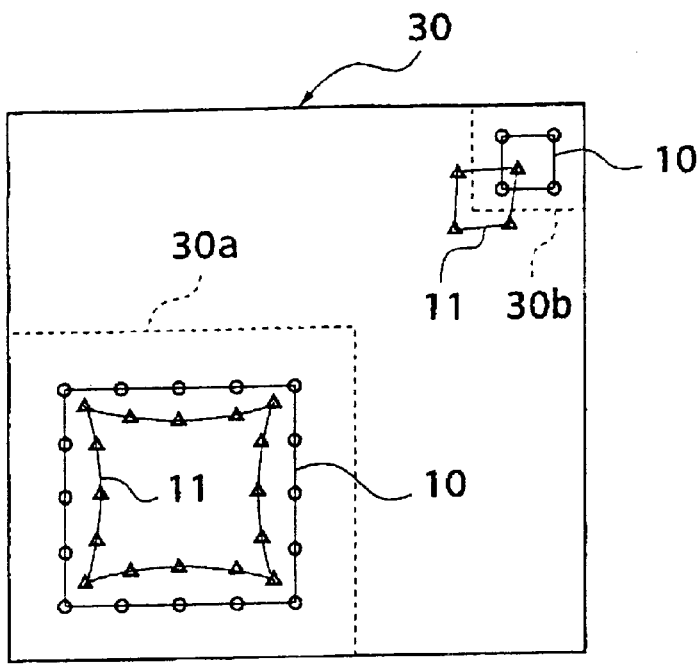
Figure 10:
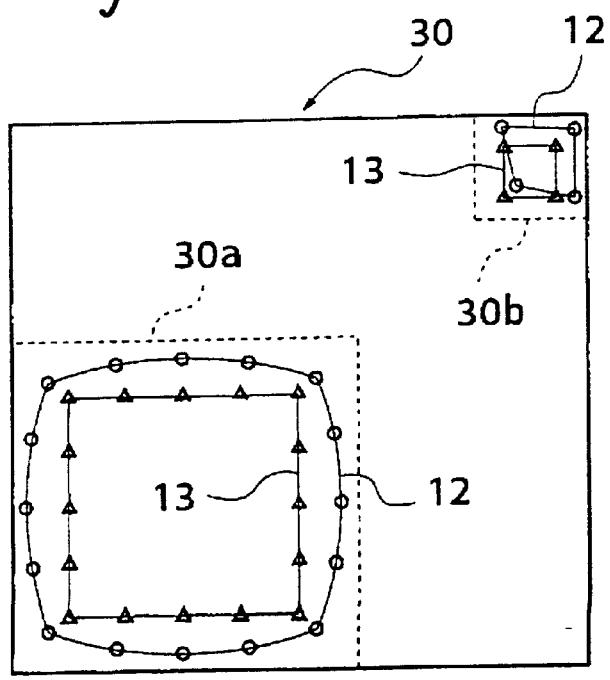

FIG. 10 shows a charged particle beam transfer mask according to the fourth embodiment of the present invention. This charged particle beam transfer mask is a pre-distorted mask that corrects a non-uniform distortion of the transferred image caused by the Coulomb effect.

FIG. 10(a) is a top view of a sub-field of a mask in which the rotation displacement of the transfer image caused by the Coulomb effect that occurs when the pattern of the sub-field is transferred to the sensitive substrate is not corrected. FIG. 10(b) is a schematic diagram showing the image distortion of the transfer image caused by the Coulomb effect that occurs when the pattern of the sub-field shown in FIG. 10(a) is transferred to the sensitive substrate. FIG. 10(c) is a schematic diagram showing the state in which the image distortion of the transfer image caused by the Coulomb effect that occurs when the pattern of the sub-field shown in FIG. 10(a) is transferred to the sensitive substrate is corrected.

The sub-field 28 shown in FIG. 10(a) has a non-uniformity in the pattern density. This sub-field 28 has a first region 28a, a second region 28b, and a third region 2c. A current is uniformly distributed only on the first and second regions 28a and 28b. A pattern whose aperture factor is 50% is formed on the first region 28a. A pattern whose aperture factor is 100% is formed on the first region 28b. The aperture factor of the third region 28c is 0%.

As shown in FIG. 10(b), when the pattern of the sub-field 28 shown in FIG. 10(a) is transferred to the sensitive substrate 30, an image distortion is created by the Coulomb effect only inside the first and second regions 28a and 28b since the current density is non-uniformly distributed inside the first and second regions 28a and 28b. Because of the image distortion, the pattern is not transferred to the ideal transfer position 10 to which the pattern would be transferred if the image distortion had not been created. Instead, the distorted pattern is transferred to a position 11 that is displaced or distorted inward from the ideal transfer position 10. Therefore, by manufacturing a pre-distorted mask in which the pattern inside the sub-field is pre-distorted so as to cancel such an image distortion, the pattern can be transferred to the ideal transfer position when the pattern of the mask is transferred to the sensitive substrate.

As shown in FIG. 10(c), when the pattern of the sub-field of the pre-distorted mask is transferred to the sensitive substrate 30, the transferred pattern 13 is formed at the ideal position by the Coulomb effect that generates the image distortion. The pattern transfer position shown by the reference numeral 12 in the drawing indicates the position to which the pattern would be transferred in the case in which the image distortion is not created in the pattern of the sub-field of the pre-distorted mask by the Coulomb effect.

The first region 30a shown in FIGS. 10(b) and (c) corresponds to the first region 28a shown in FIG. 10(a). The second region 30b shown in FIGS. 10(b) and (c) corresponds to the second region 28b shown in FIG. 10(a).

The pattern distortion inside the sub-field 28 of the pre-distorted mask is pre-obtained before manufacturing the mask so as to eliminate the image distortion created by the Coulomb effect. That is, the Coulomb effect distortion generated by the non-uniform pattern inside the sub-field 28 is obtained before manufacturing the mask by a simulation. A pre-distorted mask on which a pre-distorted pattern is then formed so as to eliminate the distortion created by the Coulomb effect is then manufactured. As a result, when the pattern on this pre-distorted mask is transferred to the sensitive substrate, the pattern distortion caused by the Coulomb effect that occurs when the current distribution is non-uniform is corrected. Consequently, the pattern can be transferred to the ideal position.

ADVANTAGES OF THE INVENTION

Thus, according to the present invention, the position of the sub-field in the optical axis direction is pre-varied so as to eliminate the differences in the de-focus amounts caused by Coulomb effect due to the differences in the pattern densities when the pattern is transferred subfields-wise. Therefore, a charged particle beam transfer mask in which the difference in the de-focus amount caused by Coulomb effect, which occurs when the pattern density is non-uniform, is corrected, can be provided.

Moreover, according to the present invention, the pattern inside the sub-field is pre-distorted so as to eliminate the pattern distortion that is generated by the Coulomb effect when the pattern inside the subfields is transferred. Therefore, a charged particle beam transfer mask in which the pattern distortion caused by the Coulomb effect is corrected can be provided.

BRIEF DESCRIPTION OF THE REFERENCE CODES

| | |
|---|---|
| 1: | lens |
| 2: | focal point plane |
| 3: | de-focus caused by Coulomb effect |
| 4: | blur caused by Coulomb effect |
| 5: | charged particle beam |
| 6: | charged particle beam transfer mask |
| 7: | mask supporter |
| 8: | subfields |
| 8a: | subfields with large pattern density |
| 8b: | subfields with intermediate pattern density |
| 8c: | subfields with small pattern density |
| 10: | ideal transfer position |
| 11: | position of transfer pattern after being distorted |
| 12: | position of transfer pattern when there is no image distortion |
| 13: | transfer pattern |
| 15: | subfields |
| 16: | stencil pattern |
| 16': | transfer pattern |
| 17: | membrane region |
| 18: | irradiation region |
| 19: | ideal transfer position |
| 20: | subfields |
| 21: | stencil pattern |
| 21': | transfer pattern |
| 22: | stencil pattern |
| 22': | transfer pattern |
| 23: | stencil pattern |
| 23': | transfer pattern |

-continued

| | |
|---|---|
| 24: | subfields |
| 28a: | first region |
| 28b: | second region |
| 28c: | third region |
| 30: | sensitive substrate |
| 30a: | first region |
| 30b: | second region |
| 41: | silicon substrate |
| 43, 45: | resist membrane |

What is claimed is:

1. A charged particle beam transfer mask for transferring a pattern onto a sensitive substrate, the mask comprising a plurality of sub-fields, having different pattern density, wherein the sub-fields are made of a thin film, and a position of each of said sub-fields is varied in direction of an optical axis depending on the pattern density of said sub-field so as to compensate beam focus displacement caused by Coulomb effect resulting from different pattern densities of the sub-fields when a charged particle beam irradiates onto each of said sub-fields and transfers a reduced image of said pattern onto the sensitive substrate.

2. A charged particle beam transfer mask, comprising a plurality of sub-fields each of which having a pattern, wherein a charged particle beam irradiates onto each of said sub-fields and transfers a reduced image of said pattern onto a sensitive substrate inside respective sub-field, wherein said pattern is a pre-distorted pattern to compensate pattern distortion caused by Coulomb effect which is generated when said pattern inside each sub-field is transferred.

3. A charged particle beam transfer mask as claimed in claim 2, wherein said pattern distortion includes a rotation displacement of an image.

4. A charged particle beam transfer mask as claimed in claim 2, wherein said pattern distortion includes a magnification factor displacement.

5. A charged particle beam transfer mask as claimed in claim 2, wherein said pattern distortion includes an orthogonal factor displacement.

6. A charged particle beam transfer mask as claimed in claim 2, wherein said pattern distortion includes a high order curve-shaped displacement.

* * * * *